US006638571B2

(12) United States Patent
Hirakawa et al.

(10) Patent No.: US 6,638,571 B2
(45) Date of Patent: Oct. 28, 2003

(54) COATED CEMENTED CARBIDE CUTTING TOOL MEMBER AND PROCESS FOR PRODUCING THE SAME

(75) Inventors: Yoshio Hirakawa, Ibaraki-ken (JP); Tetsuhiko Honma, Ibaraki-ken (JP); Hitoshi Kunugi, Ibaraki-ken (JP); Toshiaki Ueda, Saitama-ken (JP)

(73) Assignee: Mitsubishi Materials Corporation, Tokyo (JP)

( * ) Notice: Subject to any disclaimer, the term of this patent is extended or adjusted under 35 U.S.C. 154(b) by 69 days.

(21) Appl. No.: 09/984,133

(22) Filed: Oct. 29, 2001

(65) Prior Publication Data

US 2002/0086147 A1 Jul. 4, 2002

Related U.S. Application Data

(62) Division of application No. 09/583,773, filed on May 31, 2000, now Pat. No. 6,338,894.

(51) Int. Cl.$^7$ .............................................. C23C 16/36
(52) U.S. Cl. ..................... 427/255.391; 427/255.31; 427/255.7; 204/192.1
(58) Field of Search .................. 427/249.1, 249.19, 427/255.391, 255.31, 255.7; 204/192.1

(56) References Cited

U.S. PATENT DOCUMENTS

| | | | | |
|---|---|---|---|---|
| 4,784,923 A | * | 11/1988 | Graham | 428/698 |
| 4,803,127 A | * | 2/1989 | Hakim | 428/457 |
| 5,372,873 A | | 12/1994 | Yoshimura et al. | |
| 5,374,471 A | | 12/1994 | Yoshimura et al. | |
| 5,576,093 A | | 11/1996 | Yoshimura et al. | |
| 5,652,045 A | | 7/1997 | Nakamura et al. | |
| 5,665,431 A | | 9/1997 | Narasimhan | |
| 5,681,651 A | | 10/1997 | Yoshimura et al. | |
| 5,702,808 A | | 12/1997 | Ljungberg et al. | |
| 5,861,210 A | | 1/1999 | Lenander et al. | |
| 5,863,640 A | | 1/1999 | Ljungberg et al. | |
| 5,920,760 A | | 7/1999 | Yoshimura et al. | |
| 5,968,595 A | * | 10/1999 | Kutscher | 427/255.1 |
| 6,139,968 A | * | 10/2000 | Knapp et al. | 428/428 |
| 6,177,178 B1 | | 1/2001 | Ostlund et al. | |

FOREIGN PATENT DOCUMENTS

| | | | | |
|---|---|---|---|---|
| EP | 0 643 152 | | 3/1995 | |
| EP | 08001412 | * | 1/1996 | ........... B23B/27/14 |
| JP | 08-001412 | | 1/1996 | |

* cited by examiner

*Primary Examiner*—Bret Chen
(74) *Attorney, Agent, or Firm*—Oblon, Spivak, McClelland, Maier & Neustadt, P.C.

(57) ABSTRACT

The present invention relates to a coated cemented carbide cutting tool member, which includes:

a substrate and a hard coating layer deposited on the substrate, wherein the hard coating layer has an average thickness of 3 to 25 μm and includes:

(1) at least one layer having an average thickness of 0.1 to 5 μm and including a granular Ti compound selected from the group including TiC, TiN, TiCN, $Ti_2O_3$, TiCO, TiNO, TiCNO and mixtures thereof;

(2) a TiCN layer having an average thickness is 2 to 15 μm and including a longitudinal growth crystal structure; and (3) an $Al_2O_3$ layer having an average thickness of 0.5 to 8 μm;

wherein the TiCN layer includes a growth direction and a compositional gradient of carbon and nitrogen along the growth direction. The invention also relates to a process for producing a coated carbide member, which includes depositing a TiCN layer with a reactive gas, the layer having a lower portion and an upper portion; and, during the depositing, changing a concentration in the reactive gas of at least one selected from the group including $CH_3CN$, $CH_4$, $N_2$, and mixtures thereof; wherein the depositing of the lower portion is carried out at a deposition temperature of 850–950° C., and the depositing of the upper portion is carried out at a deposition temperature of 960–1040° C. The invention also provides a coated carbide member produced by the above-noted process. By use of the present invention, a coated carbide member is provided that resists chipping of cutting edge over long periods of time even when used for high speed, high feed, and thick depth-of-cut interrupted cutting operations of steels and cast irons.

20 Claims, No Drawings

COATED CEMENTED CARBIDE CUTTING TOOL MEMBER AND PROCESS FOR PRODUCING THE SAME

This application is a Divisional Application of U.S. application Ser. No. 09/583,773, filed on May 31, 2000, now U.S. Pat. No. 6,338,894.

BACKGROUND OF THE INVENTION

1. Field of the Invention

The present invention relates to a coated cemented carbide cutting tool member (hereinafter referred as "coated carbide member") that resists breakage and chipping of its cutting edge for a long period of time, particularly when it is applied to cutting operations of extremely severe conditions such as high speed, high feed, thick depth-of-cut interrupted cutting of steels and cast irons.

2. Description of the Related Art

Coated carbide members are widely used in various fields of cutting operations, for example, continuous and interrupted cutting operation of metal work pieces such as steels and cast irons. Coated carbide members are typically manufactured by depositing a hard coating layer having an average thickness of 3 to 25 $\mu$m and including (a) at least one titanium compound layer having an average thickness of 0.1 to 5 $\mu$m and composed of at least one layer of granular titanium compound selected from titanium carbide (hereinafter referred to as "TiC"), titanium nitride (TiN), titanium carbonitride (TiCN), titanium oxide (Ti$_2$O$_3$), titanium carboxide (TiCO), titanium nitroxide (TiNO) and titanium carbonitroxide (TiCNO), (b) TiCN layer having longitudinal growth crystal structure (1-TiCN) with its average thickness of 2 to 15 $\mu$m, and (c) aluminum oxide (Al$_2$O$_3$) layer having an average thickness of 0.5 to 8 $\mu$m, on tungsten carbide-based cemented carbide substrate. The common technique for depositing hard coating layer includes CVD (Chemical Vapor Deposition) and/or PVD (Physical Vapor Deposition).

Al$_2$O$_3$ has several different crystal polymorphs, among which the alpha-Al$_2$O$_3$ is known as thermodynamically the most stable polymorph having corundum structure, and typical polymorphs of Al$_2$O$_3$ used as a hard coating layer are stable alpha-Al$_2$O$_3$ and meta-stable kappa-Al$_2$O$_3$. 1-TiCN layer is manufactured by the CVD method at moderate temperatures such as 700 to 950° using a reaction gas mixture, which includes organic cyanide compounds such as acetonitrile (CH$_3$CN), such as disclosed in Japanese Unexamined Patent Publication No. 6-8010 and No. 7-328808.

In recent years, there has been an increasing demand for cutting operations that save labor and time. Accordingly, the conditions under which the cutting operation takes place have become more severe, i.e., high speed, high feed and thick depth-of-cut. With regard to conventional coated carbide members, the 1-TiCN layer found in conventional hard coating layers has fairly good toughness itself, and consequently the whole hard coating layer also shows sufficient toughness. Thus, the conventional hard coating layer exhibits excellent cutting performance without any chipping at cutting edge during continuous high speed cutting operations. When subjected to extremely severe cutting conditions (e.g., high speed, high feed and thick depth-of-cut interrupted cutting), however, the cutting edge of conventional hard coating layers are subject to chipping because of insufficient toughness, and, consequently, the tool lifetime becomes shorter.

SUMMARY OF THE INVENTION

Accordingly, one object of the present invention is to provide a coated carbide member that resists chipping of cutting edge over long periods of time even when used for high speed, high feed, and thick depth-of-cut interrupted cutting operations of steels and cast irons.

This and other objects have been attained by the present invention, the first embodiment of which provides a coated cemented carbide cutting tool member, which includes:

a substrate and a hard coating layer deposited on the substrate, wherein the hard coating layer has an average thickness of 3 to 25 $\mu$m and includes:
(1) at least one layer having an average thickness of 0.1 to 5 $\mu$m and including a granular Ti compound selected from the group including TiC, TiN, TiCN, Ti$_2$O$_3$, TiCO, TiNO, TiCNO and mixtures thereof;
(2) a TiCN layer having an average thickness is 2 to 15 $\mu$m and including a longitudinal growth crystal structure; and
(3) an Al$_2$O$_3$ layer having an average thickness of 0.5 to 8 $\mu$m; wherein the TiCN layer includes a growth direction and a compositional gradient of carbon and nitrogen along the growth direction.

Another embodiment of the present invention is a process for producing a coated carbide member, which includes:

depositing a TiCN layer with a reactive gas, the layer having a lower portion and an upper portion; and during the depositing, changing a concentration in the reactive gas of at least one selected from the group including CH$_3$CN, CH$_4$, N$_2$, and mixtures thereof; wherein the depositing of the lower portion is carried out at a deposition temperature of 850–950° C., and the depositing of the upper portion is carried out at a deposition temperature of 960–1040° C.

Another embodiment of the invention provides a coated carbide member, produced by the above-noted process.

DETAILED DESCRIPTION OF THE PREFERRED EMBODIMENTS

Various other objects, features and attendant advantages of the present invention will be more fully appreciated as the same becomes better understood from the following detailed description of the preferred embodiments of the invention.

The present invention is particularly suitable for providing a hard coating layer that is coated on the cutting member of a cutting tool. The term "cutting member" refers to the part of the cutting tool that actually cuts the work piece. Cutting members preferably include exchangeable cutting inserts which are mounted on the bit holders of turning tools, face milling cutter bodies, and end-milling cutter bodies. Cutting members also preferably include the cutting blade of drills and end-mills. The cutting member is preferably made of tungsten carbide-based cemented carbide substrates.

The order of depositing the layers (1–3) is not particularly limited, and more than one of each layer may be deposited, so long as at least one of each layer is present.

Preferably, the hard coating layer is deposited on the substrate by chemical vapor deposition and/or physical vapor deposition.

The hard coating layer preferably coats a portion of the surface, more preferably the entire surface of the cutting member. The hard coating layer preferably includes (a) at least one titanium compound layer composed of at least one layer of granular titanium compound selected from TiC, TiN, TiCN, $Ti_2O_3$, TiCO, TiNO and TiCNO, (b) 1-TiCN layer having a compositional gradient of C and N along with its growth direction, and expressed as $TiC_{1-x}N_x$, wherein x ranges from 0.45 to 0.95 at top portion, and it ranges from 0.05 to 0.40 at bottom portion, and (c) $Al_2O_3$ layer.

Preferably, the growth direction of the (gradient) TiCN layer is from the surface on which the TiCN layer is deposited, and the terms "upper" or "top" portion and "lower" or "bottom" portion are with respect to the surface on which the TiCN layer is deposited; the lower or bottom portions being deposited first, and the upper or top portions being deposited on the lower or bottom portion. The TiCN layer may be preferably deposited on the substrate, or may also preferably be deposited on one or more intervening layers.

The present invention is particularly suitable for coated carbide member is having a long lifetime and whose hard coating layer has excellent toughness characteristics. The present inventors have found:

(A) Continuous or periodical changes of the gas concentration of the reactive gas component such as $CH_3CN$, $CH_4$ and/or $N_2$ during the deposition of 1-TiCN layer gives 1-TiCN layer that has a compositional gradient of C and N along with its growth direction, and preferably the concentration of C decreases and that of N increases from bottom to top in that layer. This gradient 1-TiCN layer is preferably expressed by molecular formula $TiC_{1-x}N_x$, wherein x is the atomic ratio of N to the sum of C and N, and it ranges from 0.45 to 0.95 at top portion of the gradient 1-TiCN layer and ranges from 0.05 to 0.40 at bottom portion of it. The concentration gradient from bottom portion to top portion may vary continuously or step by step, owing to its manufacturing gas condition.

Preferably, the deposition temperature is changed from 850–950° C. for the bottom portion to 960–1040° C. for the top portion together with the change in gas concentration mentioned above, in terms of giving a more favorable crystal structure of the gradient 1-TiCN layer. More preferably, the bottom portion is deposited at a deposition temperature of 875–925° C., most preferably 885–900° C. More preferably, the top portion is deposited at a deposition temperature of 980–1020° C., most preferably 990–1010° C.

(B) The gradient 1-TiCN layer according to the invention has excellent toughness compared to conventional 1-TiCN layer manufactured by CVD method at moderate temperature range such as 700 to 950° C. without any compositional gradient. Therefore, in the coated carbide member that includes the gradient 1-TiCN layer according to the present invention as a constituent of hard coating layer, the hard coating layer itself desirably exhibits excellent toughness and imparts excellent long tool lifetimes without any chipping at the cutting edge, even when it is applied to extremely severe cutting operations such as high speed, high feed, and thick depth-of-cut interrupted cutting of steels and cast irons.

The present invention provides for a coated carbide member that exhibits superior resistance against chipping at cutting edge for a long period of time even when it is applied to extremely severe cutting operations such as high speed, high feed, and thick depth-of-cut interrupted cutting of steels and cast irons, because of excellent toughness of the hard coating layer, by providing a coated carbide member preferably composed of a cemented carbide substrate and a hard coating layer preferably having an average thickness of 3 to 25 µm formed on the substrate by means of CVD and/or PVD method, and that comprise (a) at least one titanium compound layer having average thickness of 0.1 to 5 µm and composed of at least one layer of granular titanium compound selected from TiC, TiN, TiCN, $Ti_2O_3$, TiCO, TiNO and TiCNO, (b) 1-TiCN layer that has compositional gradient of C and N along its growth direction having average thickness of 2 to 15 µm and expressed by molecular formula $TiC_{1-x}N_x$, wherein x is the atomic ratio of N to the sum of C and N, and it ranges from 0.45 to 0.95 at top portion and ranges from 0.05 to 0.40 at bottom portion, and (c) $Al_2O_3$ layer having average thickness of 0.5 to 8 µm.

The average thickness of the hard coating layer is preferably 3 to 25 µm, more preferably 5 to 20 µm, and most preferably 7 to 15 µm. Excellent wear resistance cannot be achieved at a thickness of less than 3 µm, whereas breakage and chipping at the cutting edge of the cutting member easily occur at a thickness of over 25 µm.

Individual Ti compound layers are believed to ensure sufficient adherence between different two layers. It becomes difficult to keep sufficient adherence at a thickness of less than 0.1 µm, whereas wear resistance decreases at a thickness of over 5 µm. Accordingly, the average thickness of individual Ti compound layers independently of one another is set to 0.1 to 5 µm, preferably 0.5 to 4.5 µm, more preferably 0.75 to 4 µm, more particularly preferably 1 to 3.5 µm, and most preferably 1.5 to 3 µm.

The $Al_2O_3$ layer is believed to increase wear resistance of hard coating layer especially for high speed cutting operation because of its satisfactory properties such as thermal barrier and oxidation resistance. It becomes difficult to achieve enough wear resistance at a thickness of less than 0.5 µm, whereas chipping at cutting edge easily becomes to occur at a thickness of over 8 µm. Accordingly, the average thickness of the $Al_2O_3$ layer is set to 0.5 to 8 µm, preferably 0.75 to 7 µm, more preferably 1 to 6 µm, more particularly preferably 2 to 5 µm, and most preferably 3 to 4 µm.

The gradient 1-TiCN layer is believed to improve the toughness of hard coating layer as noted above. It becomes difficult to provide satisfactory properties of this layer at a thickness of less than 2 µm, whereas wear resistance of this layer decrease sharply at a thickness of over 15 µm. Accordingly, the average thickness of the gradient 1-TiCN layer is set to 2 to 15 µm, preferably 2.5 to 12.5 µm, more preferably 3 to 10 µm, more particularly preferably 4 to 7 µm, and most preferably 5 to 6 µm.

With regard to the gradient 1-TiCN layer expressed as $TiC_{1-x}N_x$, when the x value the at top portion is less than 0.45 or when that value at the bottom portion is more than 0.40, the concentration gradient of C and N becomes rather small, and as a consequence further improvement of layer toughness cannot be attained. Similarly, when the x value at the top portion is more than 0.95 or when that value at bottom portion is less than 0.05, it becomes difficult to secure its longitudinal crystal structure, and as a consequence the toughness of the layer decreases sharply, then chipping at the cutting edge may occur. Accordingly, the x value at top portion is preferably set to 0.45 to 0.95, more preferably 0.50 to 0.85, and most preferably 0.55 to 0.75; and the x value at bottom portion is preferably set to 0.05 to 0.40, more preferably 0.10 to 0.35, and most preferably 0.15 to 0.30.

A preferable embodiment is a coated carbide member for a cutting tool that includes a substrate and a hard coating layer on the substrate, wherein the hard coating layer includes (a) at least one titanium compound layer composed of at least one layer of granular titanium compound selected from the group including TiC, TiN, TiCN, $Ti_2O_3$, TiCO, TiNO, TiCNO, and mixtures thereof; (b) 1-TiCN layer having a compositional gradient of carbon (C) and nitrogen (N) along with its growth direction (gradient 1-TiCN); and (c) $Al_2O_3$ layer, wherein gradient 1-TiCN is expressed by molecular formula $TiC_{1-x}N_x$, wherein x is the atomic ratio of N to the sum of C and N, and it ranges from 0.45 to 0.95 at top portion of the gradient 1-TiCN layer and ranges from 0.05 to 0.40 at bottom portion thereof.

Another preferable embodiment of the present invention is to provide a process for producing a coated carbide member with gradient 1-TiCN layer by changing the gas concentration of the reactive gas concentration of $CH_3CN$, $CH_4$, and/or $N_2$, and the deposition temperature, from 850–950° C. for the bottom portion to 960–1040° C. for the top portion, during the deposition period of 1-TiCN layer.

Having generally described this invention, a further understanding can be obtained by reference to certain specific examples that are provided herein for purposes of illustration only and are not intended to be limiting unless otherwise specified.

EXAMPLES

Example 1

The following powdered materials were prepared as raw materials for substrates: a WC powder with an average grain size of 1.5 μm or 3.0 μm, a (Ti,W)CN powder (TiC/TiN/WC=24/20/56) with an average grain size of 1.2 μm, a TaC/NbC powder (TaC/NbC=90/10) with an average grain size of 1.3 μm, a $Cr_3C_2$ powder with an average grain size of 1 μm, a VC powder with an average grain size of 1.2 μm and Co powder with an average grain size of 1.2 μm. Those powders were compounded based on the formulation shown in Table 1, wet-mixed in a ball mill for 72 hours and dried. Several dry powder mixtures were prepared in this manner and then each was pressed at a pressure of 1 ton/cm² to form green compacts, which were sintered under the following conditions; pressure : 0.001Torr, temperature: 1400 to 1460° C., holding duration: 1 hour, to manufacture cemented carbide insert substrates A through E defined in ISO-CNMG120408 (the entire contents of which are hereby incorporated by reference), whose shape is shown in FIG. 1.

The cutting edges of the cemented carbide insert substrates A through F were honed. Each substrate was subjected to chemical vapor deposition using conventional equipment under the conditions shown in Tables 2 and 3 to provide hard coating layers on the substrate. Individual coating layers shown in Table 2 has homogeneous composition from bottom to top of that layer, and every coating layers other than 1-TiCN in Table 2 has granular crystal structure. To manufacture coated cemented carbide inserts in accordance with the present invention and conventional, a hard coating layer was coated on each substrate, wherein the designed coating layer structure and thickness of each layer is shown in Tables 4, 5. Coated cemented carbide inserts in accordance with the present invention 1 through 10 and conventional coated carbide inserts 1 through 10 were manufactured in such a manner.

In Table 4, the description for example this invention 1 "1-TiCN (a) ~1-TiCN (2) [5 steps], (4.3)" means a gradient 1-TiCN layer of 4.3 μm of its aimed thickness which has prepared by following method, that is, bottom portion of the layer was manufactured using gas condition of 1-TiCN (a) in Table 3, top portion of the layer was manufactured using gas condition of 1-TiCN (2), and there were 5 steps of change in gas concentration of $CH_3CN$, $CH_4$ and/or $N_2$ during deposition of the layer. Likewise, the description for example this invention 2 "1-TiCN (b) ~1-TiCN (1) (continuous), (3.8)" means a gradient 1-TiCN layer of 3.8 μm of its aimed thickness which has prepared by following method, that is, bottom portion of the layer was manufactured using gas condition of 1-TiCN (b) in Table 3, top portion of the layer was manufactured using gas condition of 1-TiCN (1), and there was a continuous change in gas concentration of $CH_3CN$, and/or $N_2$ during deposition of the layer.

To investigate the x value at the portion both 0.2 μm from upper interface and 0.2 μm from lower surface of individual gradual 1-TiCN layer for coated cemented carbide in accordance with present invention 1 through 10, a cross-sectional analysis using Auger Electron Spectroscopy (AES) was performed and it was confirmed that x value of individual gradient 1-TiCN layer was almost identical to the designed value. From the investigation of the hard coating layers using optical microscope, the thickness of each layer was almost identical to designed thickness.

Further, for coated cemented carbide inserts of the present invention 1 through 10 and conventional coated cemented carbide inserts 1 through 10, the following interrupted cutting tests were conducted. The wear width on the flank face was measured in each test. The results are shown in Table 6.

(1-1) Cutting style: Interrupted turning of alloyed steel
  Work piece: JIS SCM440 round bar having 4 longitudinally grooves
  Cutting speed: 300 m/min
  Feed rate: 0.32 mm/rev
  Depth of cut: 5 mm
  Cutting time: 10 min
  Coolant: Dry
(1-2) Cutting style: Interrupted turning of alloyed steel
  Work piece: JIS SCM440 round bar having 4 longitudinally grooves
  Cutting speed: 300 m/min
  Feed rate: 0.6 mm/rev
  Depth of cut: 1.5 mm
  Cutting time: 10 min
  Coolant: Dry

TABLE 1

| Carbide substrate | Composition (wt %) | | | | | |
|---|---|---|---|---|---|---|
| | Co | (Ti, W)CN | (Ta, Nb)C | $Cr_3C_2$ | VC | WC |
| A | 6 | — | 2 | — | — | Balance (1.5 μm) |
| B | 6 | 6 | — | 0.1 | 0.2 | Balance (3.0 μm) |
| C | 7 | 7 | 5 | 0.4 | — | Balance (3.0 μm) |
| D | 8 | 5 | 4 | 0.4 | 0.2 | Balance (3.0 μm) |
| E | 10 | — | — | 0.1 | — | Balance (1.5 μm) |

WC: average grain size 1.5 μm or 3.0 μm

TABLE 2

Manufacturing conditions of hard coating layer

| Hard coating layer | Composition of reactive gas (volume %) | Ambience Pressure (Torr) | Temperature (° C.) |
|---|---|---|---|
| TiC | TiCl$_4$:3%, CH$_4$:4%, H$_2$:Balance | 50 | 1020 |
| TiN (1st layer) | TiCl$_4$:3%, N$_2$:40%, H$_2$:Balance | 150 | 900 |
| TiN (others) | TiCl$_4$:3%, N$_2$:45%, H$_2$:Balance | 50 | 1040 |
| 1-TiCN | TiCl$_4$:3%, N$_2$:30%, CH$_3$CN:1%, H$_2$:Balance | 50 | 900 |
| TiCN | TiCl$_4$:3%, N$_2$:6%, CH$_4$:2%, H$_2$:Balance | 120 | 960 |
| Ti$_2$O$_3$ | TiCl$_4$:3%, CO2:2%, H$_2$:Balance | 100 | 1020 |
| TiCO | TiCl$_4$:3%, CO:2%, CH$_4$:2%, H$_2$:Balance | 100 | 1000 |
| TiNO | TiCl$_4$:3%, N$_2$:30%, CO:2%, H$_2$:Balance | 120 | 1000 |
| TiCNO | TiCl$_4$:3%, CO:2%, CH$_4$:2%, N$_2$:30%, H$_2$:Balance | 120 | 1000 |
| α-Al$_2$O$_3$ | AlCl$_3$:5%, CO$_2$:8%, HCl:1.5%, H$_2$S:0.5%, H$_2$:Balance | 50 | 1000 |
| κ-Al$_2$O$_3$ | AlCl$_3$:5%, CO$_2$:6%, HCl:1.5%, H$_2$S:0.3%, H$_2$:Balance | 50 | 950 |

TABLE 3

Manufacturing conditions of gradient 1-TiCN layer

| | 1-TiCl-xNx layer | Composition of reactive gas (volume %) | pressure (kPa) | temperature (° C.) |
|---|---|---|---|---|
| upper portion | 1-TiCN (1) (x:0.45) | TiCl$_4$:2%, N$_2$:30%, CH$_4$:1%, CH$_3$CN:0.6%, H$_2$:Balance | 8.0 | 980 |
| | 1-TiCN (2) (x:0.55) | TiCl$_4$:2%, N$_2$:30%, CH$_4$:0.6%, CH$_3$CN:0.4%, H$_2$:Balance | 8.0 | 980 |
| | 1-TiCN (3) (x:0.65) | TiCl$_4$:2%, N$_2$:35%, CH$_4$:0.3%, CH$_3$CN:0.4%, H$_2$:Balance | 8.0 | 980 |
| | 1-TiCN (4) (x:0.75) | TiCl$_4$:2%, N$_2$:35%, CH$_4$:0.1%, CH$_3$CN:0.2%, H$_2$:Balance | 8.0 | 980 |
| | 1-TiCN (5) (x:0.85) | TiCl$_4$:2%, N$_2$:40%, CH$_3$CN:0.2%, H$_2$:Balance | 8.0 | 980 |
| | 1-TiCN (6) (x:0.95) | TiCl$_4$:2%, N$_2$:40%, CH$_3$CN:0.05%, H$_2$:Balance | 8.0 | 980 |
| lower portion | 1-TiCN (a) (x:0.05) | TiCl$_4$:2%, CH$_4$:3%, CH$_3$CN:0.2%, H$_2$:Balance | 8.0 | 930 |
| | 1-TiCN (b) (x:0.10) | TiCl$_4$:2%, CH$_4$:2%, CH$_3$CN:0.4%, H$_2$:Balance | 8.0 | 930 |
| | 1-TiCN (d) (x:0.20) | TiCl$_4$:2%, N$_2$:5%, CH$_4$:1%, CH$_3$CN:1%, H$_2$:Balance | 8.0 | 930 |
| | 1-TiCN (f) (x:0.30) | TiCl$_4$:2%, N$_2$:5%, CH$_3$CN:1%, H$_2$:Balance | 8.0 | 930 |
| | 1-TiCN (g) (x:0.35) | TiCl$_4$:2%, N$_2$:10%, CH$_3$CN:1%, H$_2$:Balance | 8.0 | 930 |
| | 1-TiCN (g) (x:0.40) | TiCl$_4$:2%, N$_2$:10%, CH$_3$CN:0.8%, H$_2$:Balance | 8.0 | 930 |

TABLE 4

Hard coating layer (Figure in parenthesis means designed thickness; μm)

| Insert | | Substrate | First layer | Second layer | Third layer | Fourth layer | Fifth layer | Sixth layer |
|---|---|---|---|---|---|---|---|---|
| This invention | 1 | A | TiN (0.3) | TiCN (1.5) | 1-TiCN(a) ~ 1-TiCN(2) [5 steps], (4.3) | α-Al$_2$O$_3$ (0.6) | TiN (0.3) | — |
| | 2 | B | TiC (0.4) | TiN (0.7) | 1-TiCN(b) ~ 1-TiCN(1) [continuous], (3.8) | TiCO (0.5) | κ-Al$_2$O$_3$ (7.8) | — |
| | 3 | B | TiN (0.5) | 1-TiCN(c) ~ 1-TiCN(5) [3 steps], (4.0) | TiCNO (0.6) | α-Al$_2$O$_3$ (1.8) | TiN (0.4) | — |
| | 4 | C | TiC (0.5) | 1-TiCN(c) ~ 1-TiCN(3) [continuous], (7.2) | TiC (1.5) | κ-Al$_2$O$_3$ (3.7) | α-Al$_2$O$_3$ (2.4) | TiN (0.5) |
| | 5 | C | TiN (0.5) | 1-TiCN(d) ~ 1-TiCN(4) [15 steps], (9.4) | TiCN (0.6) | TiCN (3.6) | κ-Al$_2$O$_3$ (2.2) | TiN (0.4) |
| | 6 | D | TiC (0.9) | 1-TiCN(d) ~ 1-TiCN(3) [2 steps], (8.5) | TiC (0.5) | TiCNO (0.3) | α-Al$_2$O$_3$ (2.6) | — |
| | 7 | D | TiN (0.6) | 1-TiCN(e) ~ 1-TiCN(2) [continuous], (2.1) | TiC (2.7) | TiCNO (0.5) | α-Al$_2$O$_3$ (1.4) | TiN (0.4) |
| | 8 | E | 1-TiN(e) ~ 1-TiCN(4) [continuous], (6.6) | 1-TiCN(e) ~ 1-TiCN(4) [continuous], (6.6) | Ti$_2$O$_3$ (0.5) | κ-Al$_2$O$_3$ (3.2) | TiCO (0.2) | TiN (0.4) |

TABLE 4-continued

Hard coating layer (Figure in parenthesis means designed thickness; μm)

| Insert | Substrate | First layer | Second layer | Third layer | Fourth layer | Fifth layer | Sixth layer |
|---|---|---|---|---|---|---|---|
| 9 | E | TiN (1.0) | 1-TiCN(f) ~ 1-TiCN(5) [10 steps], (12.0) | α-Al₂O₃ (1.6) | TiCO (0.2) | TiCO (0.2) | — |
| 10 | F | TiC (1.2) | TiCNO (0.7) | 1-TiCN(f) ~ 1-TiCN(6) [continuous], (14.5) | TiNO (0.5) | α-Al₂O₃ (3.4) | κ-Al₂O₃ (2.9) |

TABLE 5

Hard coating layer (Figure in parenthesis means designed thickness; μm)

| Insert | Substrate | First layer | Second layer | Third layer | Fourth layer | Fifth layer | Sixth layer |
|---|---|---|---|---|---|---|---|
| Conventional 1 | A | TiN (0.3) | TiCN (1.5) | 1-TiCN (4.3) | α-Al₂O₃ (0.6) | TiN (0.3) | — |
| 2 | B | TiC (0.4) | TiN (0.7) | 1-TiCN (3.8) | TiCO (0.5) | κ-Al₂O₃ (7.9) | — |
| 3 | B | TiN (0.5) | 1-TiCN (4.0) | TiCNO ((0.6) | α-Al₂O₃ (1.8) | TiN (0.4) | — |
| 4 | C | TiC (0.5) | 1-TiCN (7.2) | TiC (1.5) | κ-Al₂O₃ (3.7) | α-Al₂O₃ (2.4) | TiN (0.5) |
| 5 | C | TiN (0.5) | 1-TiCN (9.4) | TiN (0.6) | TiCN (3.6) | κ-Al₂O₃ (2.2) | TiN (0.4) |
| 6 | D | TiN (0.9) | 1-TiCN (8.5) | TiC (0.5) | TiCNO (0.3) | α-Al₂O₃ (2.6) | — |
| 7 | D | TiN (0.6) | 1-TiCN (2.1) | TiC (2.7) | TiCNO (0.5) | α-Al₂O₃ (1.4) | TiN (0.4) |
| 8 | E | 1-TiCN (6.6) | TiC (3.5) | Ti₂O₃ (0.5) | κ-Al₂O₃ (3.2) | TiC (0.2) | TiN (0.3) |
| 9 | E | TiC (1.0) | 1-TiCN (12.0) | 1-Al₂O₃ (1.6) | TiCO (0.2) | TiN (0.4) | — |
| 10 | F | TiC (1.2) | TiCNO (0.7) | 1-TiCN (14.5) | TiNO (0.5) | α-Al₂O₃ (3.4) | κ-Al₂O₃ (2.9) |

TABLE 6

Flank wear (mm)

| Insert | | high speed and thick depth-of-cut | high speed and high feed |
|---|---|---|---|
| This invention | 1 | 0.23 | 0.25 |
| | 2 | 0.25 | 0.28 |
| | 3 | 0.22 | 0.21 |
| | 4 | 0.18 | 0.19 |
| | 5 | 0.14 | 0.15 |
| | 6 | 0.15 | 0.14 |
| | 7 | 0.20 | 0.21 |
| | 8 | 0.18 | 0.18 |
| | 9 | 0.25 | 0.27 |
| | 10 | 0.28 | 0.30 |
| Conventional | 1 | Failure at 1 min. | Failure at 1 min. |
| | 2 | Failure at 1.5 min. | Failure at 2 min. |
| | 3 | Failure at 2.5 min. | Failure at 2 min. |
| | 4 | Failure at 3 min. | Failure at 2.5 min. |
| | 5 | Failure at 3.5 min. | Failure at 3 min. |
| | 6 | Failure at 3 min. | Failure at 3.5 min. |
| | 7 | Failure at 1 min. | Failure at 1 min. |
| | 8 | Failure at 2.5 min. | Failure at 3 min. |
| | 9 | Failure at 2 min. | Failure at 1.5 min. |
| | 10 | Failure at 0.5 min. | Failure at 1.5 min. |

All failures were caused by chipping occurred at cutting edge

Obviously, numerous modifications and variations of the present invention are possible in light of the above teachings. It is therefore to be understood that within the scope of the appended claims, the invention may be practiced otherwise than as specifically described herein.

What is claim is:

1. A process for producing a coated carbide member, comprising:
    depositing a TiCN layer with a reactive gas on a substrate, said layer having a lower portion and an upper portion; and
    during said depositing, changing a concentration in said reactive gas of at least one selected from the group consisting of $CH_3CN$, $CH_4$, $N_2$, and mixtures thereof;
    wherein said depositing of said lower portion is carried out at a deposition temperature of 850–950° C., and said depositing of said upper portion is carried out at a deposition temperature of 960–1040° C.,
    wherein the composition of said TiCN layer is $TiC_{1-x}N_x$, wherein the x value at said upper portion is in the range of 0.45 to 0.95 and the x value at said lower portion is in the range of 0.05 to 0.40.

2. The process according to claim 1, wherein said changing is stepwise.

3. The process according to claim 1, wherein said changing is continuous.

4. The process according to claim 1, further comprising depositing at least one layer having an average thickness of 0.1 to 5 μm and comprising a granular Ti compound selected from the group consisting of TiC, TiN, TiCN, $Ti_2O_3$, TiCO, TiNO, TiCNO and mixtures thereof.

5. The process according to claim 4, further comprising depositing an $Al_2O_3$ layer having an average thickness of 0.5 to 8 μm.

6. The process according to claim 5, wherein the TiCN layer is deposited before the 1-TiCN layer and the 1-TiCN layer is deposited before the $Al_2O_3$ layer.

7. The process according to claim 6, further comprising depositing a first layer of TiN.

8. The process according to claim 1, further comprising depositing at least one $Al_2O_3$ layer having an average thickness of 0.5 to 8 μm.

9. The process according to claim 1, wherein said TiCN layer has an average thickness of 2 to 15 μm and a longitudinal growth crystal structure.

10. The process according to claim 1, wherein said TiCN layer comprises a growth direction and a compositional gradient of carbon and nitrogen along said growth direction.

11. The process according to claim 1, wherein said lower portion contacts the surface of said substrate.

12. The process according to claim 1, wherein said TiCN is 1-TiCN.

13. The process of claim 12, wherein the average thickness of the 1-TiCN layer is from 2.5 to 12.5 μm.

14. The process of claim 12, wherein the average thickness of the 1-TiCN layer is from 3 to 10 μm.

15. The process of claim 12, wherein the average thickness of the 1-TiCN layer is from 4 to 7 μm.

16. The process according to claim 1, wherein depositing includes chemical vapor deposition or physical vapor deposition.

17. The process according to claim 1, wherein the average thickness of the TiCN layer is from 3 to 25 μm.

18. The process according to claim 1, wherein the substrate is a carbide substrate.

19. The process according to claim 1, wherein the composition of the TiCN layer is $TiC_{1-x}N_x$, wherein x is from 0.50 to 0.85 in the upper portion and x is from 0.10 to 0.35 in the lower portion.

20. The process according to claim 1, wherein the composition of the TiCN layer is $TiC_{1-x}N_x$, wherein x is from 0.55 to 0.75 in the upper portion and x is from 0.15 to 0.30 in the lower portion.

* * * * *